United States Patent [19]

Johannsen

[11] Patent Number: 5,028,514
[45] Date of Patent: Jul. 2, 1991

[54] METHOD OF PRODUCING AN ETCHED BASE PLATE FOR AN INK PRINT HEAD

[75] Inventor: Fred Johannsen, Varel, Fed. Rep. of Germany

[73] Assignee: AEG Olympia Aktiengesellschaft, Wilhelmshaven, Fed. Rep. of Germany

[21] Appl. No.: 345,656

[22] Filed: May 1, 1989

[30] Foreign Application Priority Data

Apr. 30, 1988 [DE] Fed. Rep. of Germany ....... 3814720

[51] Int. Cl.⁵ .............................................. G03F 7/00
[52] U.S. Cl. .................................... 430/320; 430/321; 430/323
[58] Field of Search ........................ 430/320, 321, 323

[56] References Cited

U.S. PATENT DOCUMENTS 4,096,626  6/1978  Olsen et al. ............................. 29/624
4,216,483  8/1980  Kyser et al. ..................... 346/140 R
4,390,391  6/1983  Fujita et al. .......................... 156/628

Primary Examiner—Charles L. Bowers, Jr.
Assistant Examiner—Janis L. Dote
Attorney, Agent, or Firm—Spencer & Frank

[57] ABSTRACT

A method for making an etched base plate for an ink printer head includes the steps of disposing on each face of a base plate a mask having a pattern, exposing the base plate simultaneously through the masks to light of a wavelength to which the base plate is photosenstive, heating the base plate to a temperature at which the amorphous glass structure in the exposed regions is converted to a ceramic crystalline structure and dipping the base plate into an etching agent solution to remove the crystalline structure from the base plate to thus provide in each plate face ink printing chambers, ink channels and at least one row of nozzle discharge openings in the shape of the exposed regions. The patterns formed on the masks are mirror images of each other.

4 Claims, 2 Drawing Sheets

METHOD OF PRODUCING AN ETCHED BASE PLATE FOR AN INK PRINT HEAD

CROSS REFERENCE TO RELATED APPLICATION

This application claims the priority of Federal Republic of Germany Application No. P 38 14 720.3 filed Apr. 30th, 1988.

BACKGROUND OF THE INVENTION

1. Field of the Invention

The present invention relates to a method of producing a base plate for an ink print head used in ink jet printers. The base plate, which is of a photosensitive glass material, is provided, by surface etching, with ink pressure chambers (ink printing chambers), ink channels and at least two rows of nozzle outlet openings.

2. Technology Review

An ink print head for use in ink jet printers generally includes a simple discharge (ejection) opening for ink, an ink channel and a part which generates the energy for ejecting the ink and which is situated in one part of the ink channel. According to a known method of making such an ink print head, in a plate, made, for example, of glass or metal, a fine trough is formed by cutting, machining or etching and then the plate is connected with another suitable plate to thus form an ink channel.

U.S. Pat. No. 4,096,626 discloses a method of producing a charge plate intended for charging ink droplets produced in ink jet printers. This plate is composed of several plate-shaped layers. Since these plates are composed of a photosensitive material which melts when heated, it is easy to etch in the passage holes that will serve as ink channels. However, after producing the individual plates, they must be interconnected by a suitable method. For this purpose, it is necessary to align the passage holes in the individual plates with one another. This requires significant precision and is thus expensive. This method is excessively complicated and expensive particularly for making ink print heads having a plurality of ink discharge openings arranged in several rows.

Because of the density patterns of 1/180" or 1/240" required for high print quality, it is often necessary to use more than one row of nozzles for each ink color in the massproduced ink print heads. If, for example, two rows of nozzles are disposed in two independent heads, they must be adjusted very precisely both vertically and horizontally with respect to one another. If the nozzles are part of individual, mirror-image symmetrical heads, the heads must be glued or welded together by mean of pin guides and fitting holes. In such a method the degree of precision of the pin guidance determines the attainable vertical accuracy and the sum of the thickness tolerances of the head plates determines the horizontal pattern quality.

SUMMARY OF THE INVENTION

It is therefore an object of the present invention to provide a method of producing a base plate having etched in its surface structures for an ink print head used in ink jet printers. This method makes it possible to have an ink print head which is of simple configuration and high print quality and which has a plurality of nozzle discharge openings arranged in several rows.

This object and others to become apparent as the specification progresses, are accomplished according to the invention by a method which includes the steps of: disposing on each face of a base plate a mask having a pattern exposing simultaneously the base plate through the masks to light of a wavelength to which the base plate is photosensitive, heating the base plate to a temperature at which the amorphous glass phase in the exposed regions is converted to a ceramic crystalline phase, and dipping the base plate into an etching agent solution to remove the crystalline phase from the base plate to thereby form, on each face of the base plate, ink printing chambers, ink channels and at least one row of nozzle discharge openings in the shape of the exposed regions. The patterns formed on the two opposite sides of the base plate are mirror images of each other.

Since the ink channels, the ink chambers and the nozzle discharge openings—which serve an ink print head provided, for example, with two rows of nozzle discharge openings—are disposed on opposite sides of a single base plate and are etched simultaneously in one etching process, the problems of alignment between two separate plates is avoided. Moreover, the method according to the invention permits the realization of a uniform depth for all nozzle discharge openings so that the ink droplets produced will always be uniform.

DESCRIPTION OF THE PREFERRED EMBODIMENT

Figure 1:
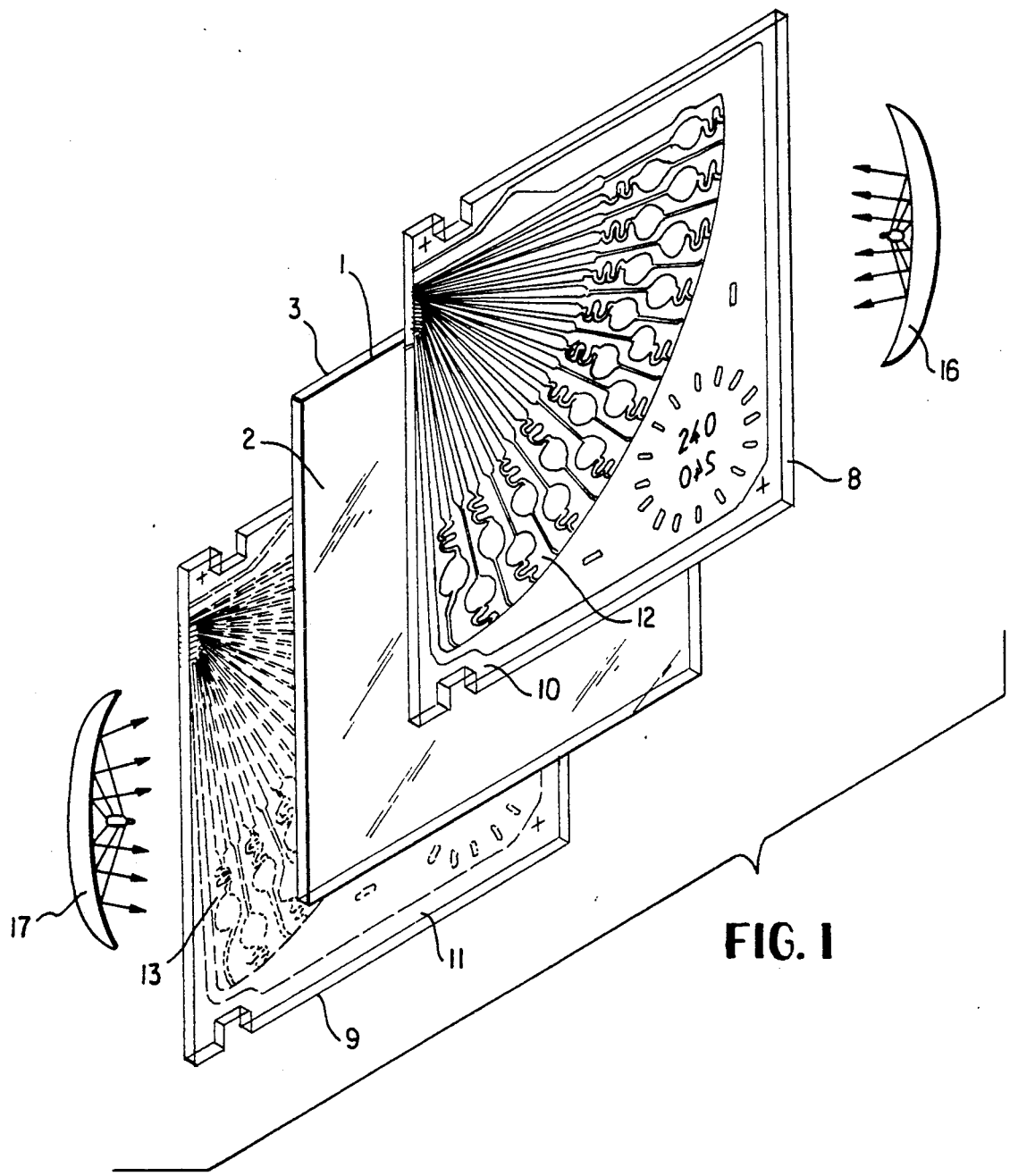
FIG. 1 is an exploded perspective view of a base plate and two masking plates.
Figure 2:
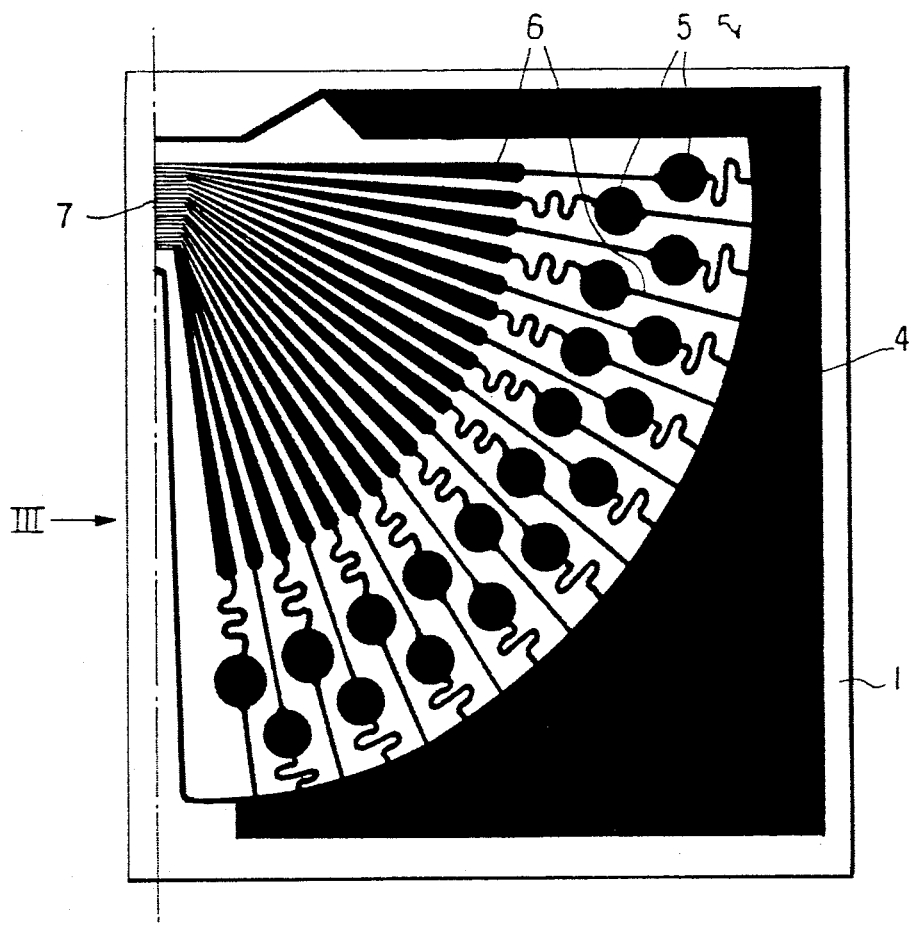
FIG. 2 is a top plan view of a base plate etched according to the invention.
Figure 3:
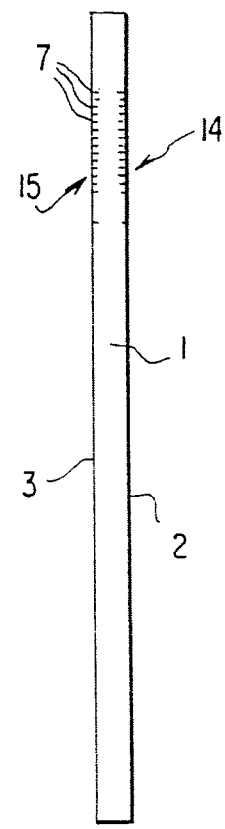
FIG. 3 is a front elevational view of the etched base plate as viewed in the direction of arrow III of FIG. 2.

FIG. 1 shows a blank base plate 1 made of a photosensitive glass material into whose surfaces 2 and 3 ink reservoir chambers 4, ink printing chambers 5, ink channels 6 and nozzle discharge openings 7 are to be etched, as shown in FIG. 2 which illustrates the base plate 1 after the etching process. The base plate 1 may be made from a commercially available photosensitive glass such as Foto-Ceram (made by the U.S. Company Corning Glass Works) or Foturan-Glas (made by the German firm Schott Glaswerke).

Figure 4:
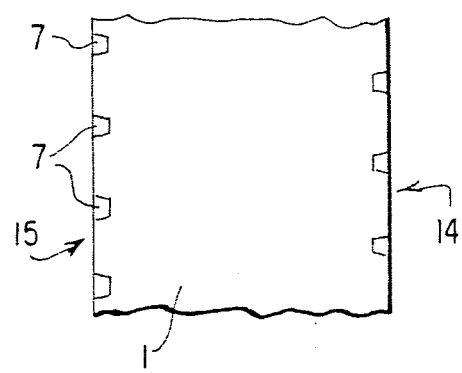
FIG. 4 is an enlarged detail of FIG. 3.

On each face of the base plate 1 there are disposed quartz glass masks 8 and 9. The masks 8 and 9 have surfaces 10 and 11, respectively, which are oriented away from the base plate 1 and to which there are applied respective ink print head layout patterns 12 and 13 by the vapor deposition of chromium. The two patterns 12 and 13 are mirror images of each other and are arranged offset on the base plate 1 so that rows 14 and 15 of nozzle discharge openings 7 which are eventually formed are offset with respect to one another such that the openings 7 in opposing rows are medially staggered relative to each other as shown in FIG. 4.

In the description which follows, the individual steps of the process according to the invention will be set forth.

First, base plate 1 is exposed through the two quartz glass masks 8 and 9 to light emanating from two light sources 16 and 17 of a wavelength to which the quartz glass material of base plate 1 is photosensitive. The two light sources 16 and 17 are preferably mercury-xenon lamps which emit collimated light. According to a preferred alternative, light sources are used that emit ultraviolet light. The openings in the patterns 12 and 13 correspond to the final sizes of the recesses etched in the base plate 1. The exposure to light produces locations of nucleation within the glass material.

After exposure to light the base plate 1 is heated at a temperature at which the amorphous glass structure in the exposed regions is converted to a ceramic crystal structure. The crystalline substance formed in the exposed regions is known as "photo opal". In this process step, the glass is brought to and maintained at its own critical temperature until the crystallization process is completed. For example, the manufacturer of the Foto-Ceram glass prescribes a temperature of 592° C. and a conversion period of 30 minutes.

The base plate 1 is subsequently immersed in a suitable etching solution which attacks the crystalline photo opal glass preferentially to the unexposed glass. A suitable etching solution is a 12% solution of hydrofluoric acid in water. The depth of the recesses etched into surfaces 2 and 3 of base plate 1 depends on the duration of the etching step.

The quantity of light emitted by the light sources 16 and 17 is selected so that the light does not pass through the base plate 1. This ensures that considering one or the other side of the base plate, etching occurs only from the exposed surface inwardly.

After the etching process, base plate 1 is ground and polished. Then membrane plates 18 and 19 (FIG. 5) are placed onto the surfaces 2 and 3 of base plate 1 to form enclosed chambers, channels and nozzles. The membrane plates 18 and 19 can be fastened to base plate 1 by gluing or by means of a sintering process.

Figure 5:
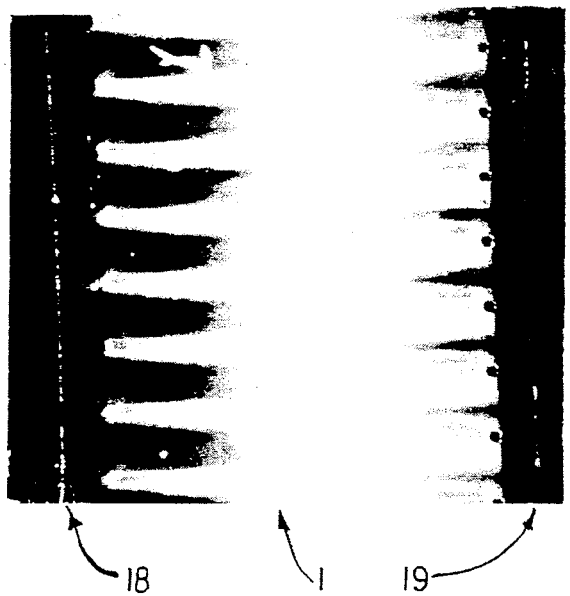
FIG. 5 is a micrograph of an ink print head having nozzle discharge openings arranged in two rows.

FIG. 5 shows a micrograph through the nozzle region of an ink print head, with the nozzle discharge openings 7 being visible in front of the dark regions containing the crystalline form. The dark strips fade away with increasing depth. The light strips in FIG. 5 indicate the unexposed areas in base plate 1 which are difficult to etch.

The chromium vapor-deposited quartz glass masks 8 and 9 employed for the exposure are mirror-images of each other and are clamped into a mask frame (not shown) in such a manner that they can be adjusted relative to one another. Alignment marks (not shown) included in the layout make it possible to set the nozzle offset to less than ±0.001 mm. All ink print heads made by exposing and etching a base plate have these slight pattern errors in their surface structures. No additional fluctuations are introduced by the manufacturing conditions. The horizontal spacing of the print pattern is determined by the etching depth and the degree to which base plate 1 is ground.

Since the nozzle rows are etched simultaneously, the nozzles in the two rows cannot have unlike diameters.

It will be understood that the above description of the present invention is susceptible to various modifications, changes and adaptations, and the same are intended to be comprehended within the meaning and range of equivalents of the appended claims.

What is claimed is:

1. A method of producing a photosensitive glass base plate for an ink print head used in ink jet printers comprising the steps of:
    (a) disposing a pair of masks, one on each side of a two-sided base plate, each said mask of said pair of masks having a pattern thereon for masking regions on said base plate and leaving regions exposed on said base plate, and each said pattern being a mirror image of the pattern on the other mask of said pair of masks;
    (b) exposing simultaneously said base plate through said pair of masks to light of a wavelength to which said base plate is photosensitive to form an amorphous glass phase in said exposed regions on said base plate;
    (c) heating said base plate to a temperature at which said amorphous glass phase in said exposed regions is converted to a ceramic crystalline phase; and
    (d) etching by dipping said heated base plate into an etching agent solution to remove said crystalline phase from said base plate to etch therein ink printing chambers, ink channels and at least one row of nozzle discharge openings in the shape of said exposed regions.

2. A method as defined in claim 1, wherein said light used in said exposing step is ultraviolet light.

3. A method as defined in claim 1, wherein said masks comprise chromium vapor-deposited quartz glass masks.

4. A method as defined in claim 1, wherein said disposing step comprises the step of arranging said masks with respect to each other on said base plate so that the nozzle discharge openings of one row in one face of said base plate are medially staggered relative to the nozzle openings of another row in the other face of said base plate.

* * * * *